United States Patent
Tawada et al.

(10) Patent No.: US 9,166,080 B2
(45) Date of Patent: Oct. 20, 2015

(54) TRANSPARENT ELECTRODE FOR THIN FILM SOLAR CELL, SUBSTRATE HAVING TRANSPARENT ELECTRODE FOR THIN FILM SOLAR CELL AND THIN FILM SOLAR CELL USING SAME, AND PRODUCTION METHOD FOR TRANSPARENT ELECTRODE FOR THIN FILM SOLAR CELL

(75) Inventors: Yuko Tawada, Otsu (JP); Takashi Fujibayashi, Nagareyama (JP)

(73) Assignee: KANEKA CORPORATION, Osaka-shi (JP)

(*) Notice: Subject to any disclaimer, the term of this patent is extended or adjusted under 35 U.S.C. 154(b) by 17 days.

(21) Appl. No.: 13/812,460

(22) PCT Filed: Jun. 7, 2011

(86) PCT No.: PCT/JP2011/063054
§ 371 (c)(1),
(2), (4) Date: Jan. 25, 2013

(87) PCT Pub. No.: WO2012/014572
PCT Pub. Date: Feb. 2, 2012

(65) Prior Publication Data
US 2013/0118580 A1    May 16, 2013

(30) Foreign Application Priority Data
Jul. 28, 2010   (JP) ................... 2010-169142

(51) Int. Cl.
*H01L 31/0224* (2006.01)
*H01L 31/18* (2006.01)

(52) U.S. Cl.
CPC .... *H01L 31/022483* (2013.01); *H01L 31/1884* (2013.01); *Y02E 10/50* (2013.01)

(58) Field of Classification Search
USPC ................................ 136/243–265
See application file for complete search history.

(56) References Cited

U.S. PATENT DOCUMENTS 6,936,188 B1 * 8/2005 Haga .................. 252/301.16
2001/0013362 A1 8/2001 Kondo
(Continued)

FOREIGN PATENT DOCUMENTS

JP        1179891 A     3/1999
JP     2000276943 A    10/2000
(Continued)

OTHER PUBLICATIONS

Hu et al., Atmospheric Pressure Chemical Vapor Deposition of Gallium Doped Zinc Oxide Thin Films from Diethyl Zinc, Water, and Triethyl Gallium, Journal of Applied Physics, Vol/Issue 72, pp. 5381-5392 (1992).*

(Continued)

*Primary Examiner* — Jayne Mershon
(74) *Attorney, Agent, or Firm* — Alleman Hall McCoy Russell & Tuttle LLP (57) ABSTRACT

Disclosed are: a transparent electrode having a zinc oxide film wherein initial characteristics and humidity resistance during long-time use coexist; and a thin film solar cell provided with said electrode. The transparent electrode contains a transparent conductive layer mainly made of zinc oxide. The transparent conductive film preferably has the following characteristics: having surface irregularities; a carrier concentration of $9\times10^{19}$ cm$^{-3}$ or less; a crystal structure having a (110) preferred orientation; a ratio of a (110) peak intensity to a (002) peak intensity I(110)/I(002) measured by X-ray diffraction being 50 or more; and a crystallite with a (110) orientation has a size of: 23 nm or more and 50 nm or less, in a planar direction parallel to a substrate; and 30 nm or more and 60 nm or less, in a planar direction perpendicular to the substrate.

11 Claims, 1 Drawing Sheet

(56) References Cited

U.S. PATENT DOCUMENTS

2007/0169805 A1     7/2007  Sasaki et al.
2009/0293954 A1*   12/2009  Yamazaki ................. 136/258
2011/0108118 A1*    5/2011  Yamarin et al. ........... 136/265

FOREIGN PATENT DOCUMENTS

| | | | |
|---|---|---|---|
| JP | 2004311704 | A | 11/2004 |
| JP | 2005311292 | A | 11/2005 |
| JP | WO 2010/004811 | * | 1/2010 |

OTHER PUBLICATIONS

International Bureau of WIPO, International Preliminary Report of PCT/JP2011/063054, Mar. 12, 2013, Switzerland, 5 pages.

ISA Japan, International Search Report of PCT/JP2011/063054, Sep. 13, 2011, WIPO, 1 page.

Steinhauser, J. et al., "Damp Heat Stability of LPCVDd ZNO:B," Technical Digest of the International PVSEC-17, pp. 166-167, Dec. 2007, 1 page.

* cited by examiner

TRANSPARENT ELECTRODE FOR THIN FILM SOLAR CELL, SUBSTRATE HAVING TRANSPARENT ELECTRODE FOR THIN FILM SOLAR CELL AND THIN FILM SOLAR CELL USING SAME, AND PRODUCTION METHOD FOR TRANSPARENT ELECTRODE FOR THIN FILM SOLAR CELL

TECHNICAL FIELD

The invention relates to a transparent electrode for a thin film solar cell having an improved reliability during long-time use, and a substrate having a transparent electrode for a thin film solar cell and a thin film solar cell using the same.

BACKGROUND ART

Recently, as a measure against problems of environmental pollution and global warming, solar cells have been actively researched and developed, and increasingly introduced as a source of clean energy. Thin film solar cells are receiving prominent attention as solar cells that allow for both reduction of costs and improvement of efficiency. In particular, methods of forming a high-quality semiconductor layer on an inexpensive substrate such as glass using a low-temperature process is expected to be capable of achieving cost reductions.

"Light confinement" has been put into practical use in which a surface of a transparent conductive film, which contacts a light incident side of a photoelectric conversion unit, is made to have irregularities (textured), and light scattered at an interface thereof is made incident into the photoelectric conversion unit to increase a light path length for the purpose of improving the photoelectric conversion efficiency of the thin film solar cell. An example of the transparent conductive film having a surface with irregularities includes a tin oxide ($SnO_2$) film deposited by a thermal chemical vapor deposition method (also referred to as "thermal CVD method"). However, since the $SnO_2$ film should be deposited by a high-temperature process at about 550 to 650° C., inexpensive substrates such as a plastic film and glass after solidification cannot be used, and therefore production costs are increased.

On the other hand, zinc oxide (ZnO) is more inexpensive than $SnO_2$ and indium tin oxide (ITO), has a high plasma resistance, and is therefore suitable as a transparent electrode material for a thin film solar cell. For example, Patent Document 1 proposes that a ground layer is formed on a transparent insulating substrate such as glass, and a ZnO film having irregularities on its surface is deposited thereon by a low-pressure thermal CVD method (also referred to as a LPCVD method or MOCVD method) under low temperature conditions of 150° C. to 200° C.

It is a widespread practice to incorporate a dopant such as boron into a ZnO film by feeding a dopant gas when depositing the ZnO film by the low-pressure thermal CVD method. By having a dopant such as boron in the ZnO film, the carrier concentration in the film is increased, so that a low-resistant zinc oxide film is obtained. However, when the carrier concentration in the film exceeds a certain level, the resistance is no longer lowered, and the light transmittance of the ZnO film decreases due to light absorption by carriers, so that the current density of a solar cell is reduced. Thus, for obtaining a solar cell excellent in conversion efficiency, the carrier concentration in the zinc oxide film as a transparent electrode material is preferably as low as possible within the range for achieving a reduction in film resistance.

On the other hand, Non-Patent Document 1 reports that in a boron (B)-doped ZnO thin film deposited by a low-pressure thermal CVD method, the humidity resistance is degraded when the carrier concentration in the film is low. It is reported in Non-Patent Document 1 that when a ZnO thin film having a carrier concentration of $8 \times 10^{19}$ $cm^{-3}$ and a thickness of 2 μm is exposed to a humidified environment, the electrical conductivity decreases by a factor of 10 or more, i.e., the resistance increases by a factor or 10 or more. If the ZnO thin film as a transparent electrode of a thin film solar cell has increased resistance as described above, the series resistance of the solar cell increases, so that characteristics of the solar cell, particularly the fill factor (FF), are degraded, leading to a reduction in conversion efficiency (Eff).

PRIOR ART DOCUMENTS

Patent Document

PATENT DOCUMENT 1: JP-A-2005-311292

Non-Patent Document

NON-PATENT DOCUMENT 1: J. Steinhauser et. al, Technical Digest of the International PVSEC-17, Fukuoka, Japan 2007, p 166

SUMMARY OF THE INVENTION

Problems to be Solved by the Invention

As described above, a thin film solar cell using a zinc oxide film as a transparent electrode has a problem such that when the carrier concentration in the zinc oxide film is high, initial characteristics (particularly short circuit current density) of the thin film solar cell are degraded due to light absorption by an excessive carrier. When the carrier concentration in the zinc oxide film is decreased, the current density increases as the transmittance of the zinc oxide film becomes higher, and a solar cell with excellent initial characteristics is obtained. On the other hand, when the carrier concentration is decreased, the thin film solar cell has a problem such that characteristics of the solar cell are easily degraded due to a reduction in fill factor (FF) during long-time use because the humidity resistance of the zinc oxide film is low. Thus, there is a trade-off between initial characteristics and durability during long-time use.

When the present inventors actually formed a transparent electrode consisting essentially of ZnO on a glass substrate by the method described in Example of Patent Document 1, and the transparent electrode was exposed to an environment having a temperature of 85° C. and a humidity of 85%, an improvement in transmittance of the ZnO film and an increase in resistance of the ZnO film, which were assumed to result from a reduction in carrier concentration, were observed as reported in Non-Patent Document 1. The improvement in transmittance of the ZnO film is found principally at a long-wavelength range of 800 nm or more, and is preferable for improvement of the short circuit current density (Jsc) of a solar cell including a photoelectric conversion layer having absorption in the long-wavelength range (e.g., a crystalline silicon photoelectric conversion layer such as thin film polycrystalline silicon or microcrystalline silicon, a germanium photoelectric conversion layer, or a compound semiconductor (CdTe, CIS, CIGS, etc.) photoelectric conversion layer). However, it has been found that a reduction in FF associated with an increase in series resistance is significant, and resultantly the conversion efficiency is reduced.

In view of the matters described above, it is an object of the present invention to achieve both improvement of initial conversion efficiency and inhibition of a reduction in conversion efficiency during long-time use in a thin film solar cell in which a ZnO transparent conductive film is applied as a transparent electrode on the light incident side.

Means for Solving the Problems

The inventors have conducted vigorous studies on formation of a transparent conductive film which has surface irregularities and a transmittance suitable for a thin film solar cell and for which humidity resistance is improved. It has been found that the crystal structure and crystallite size of a ZnO film have a correlation to the humidity resistance of a transparent electrode. Furthermore, it has been found that by applying a ZnO film having a specific orientation and crystallite size as a transparent electrode, a thin film solar cell excellent in humidity resistance is obtained even though the initial carrier concentration is low.

The present invention relates to a transparent electrode for a thin film solar cell, including a transparent conductive film mainly made of zinc oxide. The transparent conductive film preferably has the following characteristics:

the transparent conductive film has surface irregularities;

a carrier concentration of the transparent conductive film is $9 \times 10^{19}$ cm$^{-3}$ or less;

a crystal structure in the transparent conductive film has a (110) preferred orientation;

the transparent conductive film has a ratio of a (110) peak intensity to a (002) peak intensity I(110)/I(002) of 50 or more, when measured by X-ray diffraction; and a crystallite having a (110) orientation has a size of 23 nm or more and 50 nm or less in a planar direction parallel to a substrate, and 30 nm or more and 60 nm or less in a planar direction perpendicular to the substrate.

The present invention also relates to a substrate having a transparent electrode for a thin film solar cell, having the transparent electrode formed on a transparent insulating substrate. The substrate having the transparent electrode preferably has a haze ratio of 20 to 50%.

Further, the present invention also relates to a thin film solar cell having the transparent electrode or the substrate having the transparent electrode that is placed on a light incident side of at least one photoelectric conversion unit. In an embodiment, the thin film solar cell of the present invention includes a crystalline photoelectric conversion unit as the photoelectric conversion unit.

Effects of the Invention

A transparent electrode according to the present invention has a zinc oxide film consisting essentially of ZnO and having surface irregularities, and therefore provides a high light confinement effect when used as an electrode on the light incident side of a thin film solar cell. Further, the transparent electrode of the present invention has a low carrier concentration, so that absorption of light by the transparent electrode is small. Moreover, the zinc oxide film has a specific crystal property, so that an increase in resistance by influences of humidity and the like is inhibited despite the low carrier concentration. Therefore, a thin film solar cell using the transparent electrode of the present invention as an electrode on the light incident side has high initial characteristics, and degradation of its performance by influences of humidity during long-time use is inhibited.

MODE FOR CARRYING OUT THE INVENTION

Figure 1:
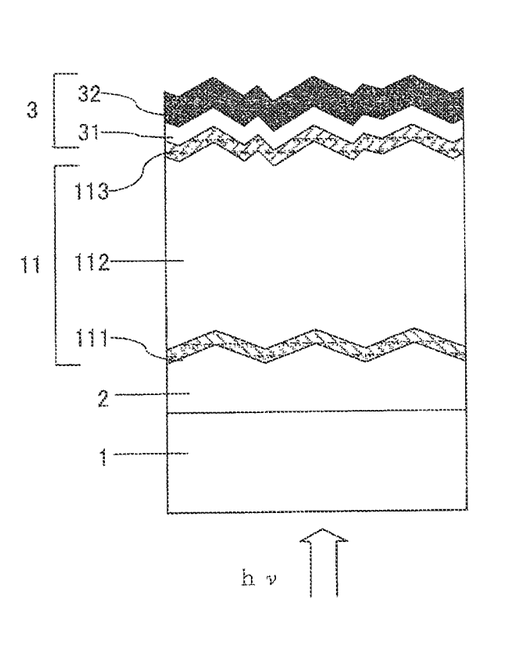
FIG. 1 is a cross-sectional view of a thin film solar cell according to one embodiment of the present invention.

FIG. 1 is a schematic sectional view showing a configuration of a thin film solar cell according to one embodiment of the present invention. The thin film solar cell in FIG. 1 includes a transparent electrode 2, a photoelectric conversion unit 11 and a back electrode 3 in this order on a transparent insulating substrate 1. This thin film solar cell is so called a "superstrate-type" thin film solar cell in which sunlight (hv) used for photoelectric conversion is made incident from the transparent insulating substrate 1 side. The photoelectric conversion unit 11 includes a one-conductivity-type layer 111 on the light incident side with respect to a photoelectric conversion layer 112, and includes an opposite-conductivity-type layer 113 on a side opposite to the light incident side. In one embodiment, the thin film solar cell of the present invention is a crystalline silicon-based thin film solar cell in which the photoelectric conversion layer 112 is a crystalline silicon-based photoelectric conversion layer. The terms "crystalline" and "microcrystalline" herein also include partially amorphous structures.

The transparent insulating substrate 1 is placed on the light incident side with respect to the photoelectric conversion unit 11 when a superstrate-type thin film solar cell is configured. Thus, the transparent insulating substrate is preferably transparent as much as possible, so that a larger amount of sunlight is absorbed in the photoelectric conversion unit(s). As the transparent insulating substrate, a glass plate, a transparent plastic film or the like is suitably used. For a similar reason, it is desirable that a light incident surface of the transparent insulating substrate is subjected to anti-reflection coating so that light reflection losses in the light incident surface are reduced. A surface of the transparent insulating substrate 1 on the transparent electrode 2 side may have fine irregularities for improving adhesive strength with the transparent electrode 2.

The transparent electrode 2 is located on the light incident side with respect to the photoelectric conversion unit 11, and contains a transparent conductive film consisting essentially of zinc oxide (hereinafter, may be referred to simply as a "zinc oxide film" or "ZnO film"). This zinc oxide film has an irregular-shaped surface. In the present invention, the size of the surface irregularities of the zinc oxide film may be set appropriately, according to the kind of the photoelectric conversion layer and the like. For example, for obtaining a light confinement effect suitable for a thin film solar cell having a crystalline silicon photoelectric conversion layer, a substrate having a transparent electrode, in which the transparent electrode 2 containing a zinc oxide film is formed on the transparent insulating substrate 1, preferably has a haze ratio of 10% or more. Particularly, for improving photoelectric conversion characteristics of the thin film solar cell, the substrate having a transparent electrode has a haze ratio of preferably about 20 to 50%, further preferably about 20 to 40%.

Here, in the present specification, the haze ratio is mainly used as an evaluation index of the surface irregularities, which affects a light confinement effect of a transparent electrode for a thin film solar cell. The haze ratio is represented by (diffusion light transmittance/total light transmittance)×100 [%] (JIS K7136). A substrate having a transparent electrode, in which the transparent electrode 2 is formed on the transparent insulating substrate 1 such as glass, is evaluated for a haze ratio together with the transparent insulating substrate.

If the size of the surface irregularities of the zinc oxide film is too small, a sufficient light confinement effect may not be obtained. Conversely, if the size of the surface irregularities is too large, electrical or mechanical short circuit may be caused to occur in the thin film solar cell, and characteristics of the thin film solar cell may be degraded. For obtaining a light confinement effect, the size surface irregularities of the zinc oxide film is preferably such that the grain size (pitch) of the irregularities is approximately 50 to 500 nm and the height of the irregularities is approximately 20 to 200 nm. If the size of the surface irregularities of the zinc oxide film is too large, electrical short circuit may occur in the thin film solar cell, and therefore the height of the irregularities is more preferably 40 to 150 nm, further preferably 50 to 120 nm.

The carrier concentration in the zinc oxide film is preferably $9 \times 10^{19}$ cm$^{-3}$ or less, more preferably $5 \times 10^{19}$ cm$^{-3}$ or less. If the carrier concentration in the zinc oxide film increases, the transmittance in a long-wavelength range decreases, so that initial characteristics (particularly short circuit current density) tend to be degraded particularly in a solar cell including a photoelectric conversion layer having light absorption in a long-wavelength range of 800 nm or more. Thus, for improvement of the efficiency of the thin film solar cell, the carrier concentration in the zinc oxide film is preferably as low as possible. On the other hand, if the carrier concentration is excessively low, the zinc oxide film has increased resistance, so that initial characteristics (particularly fill factor) tend to be degraded as the series resistance of the solar cell increases. Thus, the carrier concentration in the ZnO film is preferably $8 \times 10^{18}$ cm$^{-3}$ or more, further preferably $1 \times 10^{19}$ cm$^{-3}$ or more. The carrier concentration in the ZnO film can be analyzed by Hall measurement, spectroscopic ellipsometry, SIMS analysis or the like. A carrier concentration obtained by Hall measurement is used herein.

In the present invention, the zinc oxide film of the transparent electrode 2 preferably has a (110) preferred crystal orientation surface that is parallel to a substrate surface. A polycrystalline zinc oxide film has crystal lattice surfaces of (100), (002), (101) and (110). In the present invention, a ratio of a (110) peak intensity to a (002) peak intensity I(110)/I(002) in the zinc oxide film is preferably 50 or more, more preferably 70 or more. As the (110) peak intensity ratio of the zinc oxide film becomes higher, the humidity resistance of the zinc oxide film tends to be improved, and a zinc oxide film excellent in humidity resistance is obtained even though the carrier concentration is low. If the I(110)/I(002) value is lower than the above-described value, the resistance value of the zinc oxide film tends to be easily increased when the zinc oxide film is exposed to a high-humidity environment.

A crystallite having a (110) orientation in the zinc oxide film has a size of preferably 23 nm or more, preferably 25 nm or more in a planar direction parallel to the substrate surface. When the size of the crystallite having a (110) orientation in a planar direction parallel to the substrate surface falls within the aforementioned range, the humidity resistance of the ZnO film tends to be improved. The upper limit of the size of the crystallite having a (110) orientation in a planar direction parallel to the substrate surface is not particularly limited, but an attainable upper limit is generally about 50 nm, preferably 40 nm or less.

The crystallite having a (110) orientation in the zinc oxide film has a size of preferably 30 nm or more, more preferably 35 nm or more in a planar direction perpendicular to the substrate surface. As the crystallite size in a planar direction perpendicular to the substrate surface becomes larger, the mobility of electrons in a direction parallel to the substrate surface increases. The zinc oxide film used as the transparent electrode of the thin film solar cell requires passage of electricity in a direction parallel to the substrate surface, and therefore when the crystallite size in a planar direction perpendicular to the substrate surface is large as described above, a thin film solar cell having a high fill factor can be obtained even though the carrier concentration of the zinc oxide film is low, such as $9 \times 10^{19}$ cm$^{-3}$ or less. It is believed that under a high-humidity environment, oxygen originating from moisture in the air penetrates between crystallites of zinc oxide to reduce the mobility. Thus, it may also be important to increase the crystallite size in a planar direction perpendicular to the substrate surface for improvement of the humidity resistance of a zinc oxide film having a low carrier concentration. The upper limit of the size of the crystallite having a (110) orientation in a planar direction perpendicular to the substrate surface is not particularly limited, but an attainable upper limit is generally about 60 nm, preferably 50 nm or less.

The crystal orientation and crystallite size of the ZnO film can be calculated/evaluated from a diffraction pattern and the peak intensity of each surface obtained by an X-ray diffraction method (XRD method), and the half width of each surface. This analysis is performed by measuring a ZnO film formed on a glass substrate. The crystal lattice surface parallel to the substrate surface can be measured by a 2θ/θ measurement (one of the measurements called an out-of-plane measurement in terms of a manner in which axes of X-ray diffraction are manipulated) which is a general measurement method.

Since the ZnO film has a hexagonal system wurtzite-type crystal structure, the crystallite size considerably varies between the a-axis direction and the c-axis direction. When the zinc oxide film has a (110) preferred crystal orientation surface parallel to the substrate surface as described above, the substrate surface and the c-axis direction of the crystal structure are parallel to each other. Thus, when the crystallite size in a direction perpendicular to the substrate surface is measured, it is necessary to use an XRD method called an in-plane measurement. According to this measurement, the crystallite size, in a planar direction perpendicular to the substrate surface, i.e. a (002) preferred orientation direction, of a crystallite having a (110) preferred crystal orientation surface parallel to the substrate surface can be measured. The crystallite size is calculated by the Scherrer method based on the XRD peak intensity and the half width of the peak in both the out-plane measurement and the in-plane measurement.

A method for forming the transparent electrode of the present invention is not necessarily limited, but the zinc oxide film of the transparent electrode is preferably deposited by a low-pressure thermal CVD method. As a method for forming the zinc oxide film, generally a sputtering method and the like are widely used in addition to the low-pressure thermal CVD method, but a zinc oxide film formed by the sputtering method generally has a (002) preferred orientation, so that surface irregularities are hard to be formed. On the other hand, according to the low-pressure thermal CVD method, a zinc oxide film having surface irregularities such that a light confinement effect can be exhibited even at a low substrate temperature of 200° C. or lower, and having a (110) orientation is easily formed.

Specifically, the zinc oxide film contained in the transparent electrode is preferably formed by feeding a zinc source and an oxidant as raw material gases, a dopant gas and a diluting gas into a film forming chamber under conditions of a substrate temperature of 150° C. or higher, more preferably 160° C. or higher, and a pressure of 5 Pa to 1000 Pa by a low-pressure thermal CVD method. The substrate temperature mentioned here refers to a temperature of a surface at which the substrate contacts a heating section of a film forming apparatus.

As a raw material gas for the zinc source, for example, an alkylzinc such as diethylzinc (DEZ) or dimethylzinc is suitably used. As a raw material gas for the oxidant, for example, water, oxygen, carbon dioxide, carbon monoxide, dinitrogen oxide, nitrogen dioxide, sulfur dioxide, dinitrogen pentaoxide, alcohols (R(OH)), ketones (R(CO)R'), ethers (ROR'), aldehydes (R(COH)), amides ($(RCO)_x(NH_{3-x})$, x=1, 2, 3), or sulfoxides (R(SO)R') (where R and R' are alkyl groups) may be used. Above all, water is most suitably used as an oxidant. A raw material which is liquid at ordinary temperature and normal pressure, such as DEZ or water, is preferably vaporized by a method such as evaporation by heating, bubbling or spraying and then fed.

As the diluting gas, for example, a noble gas (He, Ar, Xe, Kr, Rn), nitrogen, hydrogen or the like is used. Above all, hydrogen gas is suitably used from the viewpoint of heat conductivity. As the dopant gas, for example, a substance containing a Group III element, such as diborane ($B_2H_6$), an alkylborane such as trimethylborane, an alkylaluminum or an alkylgallium, is suitably used. Above all, a dopant gas containing boron is preferable, and diborane is most preferable. The dopant gas is preferably diluted with a diluting gas such as hydrogen, and then introduced into a film forming chamber.

In formation of the zinc oxide film, raw material gases are preferably fed such that the stoichiometric ratio of zinc:oxygen is set in the range from 1:2 to 1:5 for the aforementioned zinc source and the oxidant. For example, when DEZ is used as the zinc source and water is used as the oxidant, the ratio of DEZ:water is preferably set to in the range of from 1:2 to 1:5. When zinc oxide is formed, the ratio of zinc to oxygen might be set to 1:1, from the stoichiometric viewpoint; but by ensuring that the feed rate of water as the oxidant is relatively high, there is a tendency that the (110) orientation of zinc oxide is improved, and the size of the crystallite is increased. The feed ratio of the zinc source (DEZ) and the oxidant (water) (water/DEZ) in deposition of the zinc oxide film by the low-pressure thermal CVD method is preferably set to 2.7 or more, and more preferably set to 2.9 or more. As the relative feed rate of water as the oxidant becomes higher, there is a tendency that the (110) orientation of zinc oxide is improved, and the size of the crystallite is increased. On the other hand, if the feed rate of the oxidant is excessively high as compared to the zinc source, it may be difficult to form a homogeneous film.

The feed rate of the dopant gas is appropriately set so that the carrier concentration in the zinc oxide film falls within the aforementioned range. For example, when $B_2H_6$ is used as the dopant gas, the flow rate of $B_2H_6$ is preferably 0.05% to 0.5% based on DEZ. By decreasing the feed rate of the dopant gas, there is a tendency that the carrier concentration in the zinc oxide film is decreased, the (110) orientation of the zinc oxide film is improved, and the size of the crystallite is increased. If the feed rate of the dopant gas is excessively high, there is a tendency that the carrier concentration in the zinc oxide film is increased to thereby reduce the transmittance, and irregularities sufficient for light confinement are hard to be formed on the surface of the zinc oxide film.

The substrate temperature during deposition of the zinc oxide film is preferably set to 150° C. or higher, more preferably 160° C. or higher, as described previously. When the substrate temperature is elevated, the (110) orientation of zinc oxide tends to be improved, but if the substrate temperature is excessively high, conversely the (110) orientation tends to be reduced. Thus, the substrate temperature during deposition of the zinc oxide film by the low-pressure thermal CVD is preferably set to 200° C. or lower. For obtaining a zinc oxide film having the aforementioned orientation and crystallite size by the low-pressure thermal CVD, the pressure at the time of deposition is preferably low. Specifically, the pressure at the time of deposition is preferably set to 50 Pa or lower, more preferably set to 30 Pa or lower.

For obtaining a zinc oxide film having the aforementioned orientation and crystallite size, it is also effective to subject the zinc oxide film to a heating treatment at a temperature of 200° C. or higher under an atmosphere including a nonoxidative gas such as hydrogen gas or argon subsequently to depositing a transparent electrode containing the zinc oxide film, besides adjusting deposition conditions for the zinc oxide film as described previously. Conditions for the heating treatment preferably include a temperature of about 200° C. to 250° C. and a pressure of about 50 Pa to 500 Pa. The heating treatment time is preferably about 10 minutes to 120 minutes.

The average thickness of the zinc oxide film is preferably 300 to 3000 nm, more preferably 500 to 2200 nm. If the zinc oxide film is too thin, it may be difficult to provide the surface of the zinc oxide film with irregularities that effectively contributes to a light confinement effect, or it may be difficult to obtain conductivity necessary as a transparent electrode. By increasing the thickness of the zinc oxide film, there is a tendency that a zinc oxide film having surface irregularities with large pitch and large height difference is obtained, the (110) orientation of the crystal is improved, and the crystallite size is increased. On the other hand, if the thickness of the zinc oxide film is too large, light absorption by the zinc oxide film itself increases, and thus there is a tendency that the amount of light reaching a photoelectric conversion unit is reduced, leading to a reduction in conversion efficiency. If the zinc oxide film is too thick, there is a tendency that the time for film formation is increased to thereby increase film formation costs.

The photoelectric conversion unit 11 is formed on the transparent electrode 2. The photoelectric conversion unit 11 in the present invention preferably includes as the photoelectric conversion layer 112 a semiconductor layer having absorption in a principal wavelength range of sunlight (400 to 1200 nm). Particularly, in the thin film solar cell of the present invention, the photoelectric conversion layer 112 preferably includes a semiconductor layer having absorption at a wavelength of 800 nm or more because the carrier concentration of the transparent electrode 2 placed on the light incident side of the photoelectric conversion unit 11 is low and the transmittance in a long-wavelength range is high. As such a semiconductor layer, there are exemplified semiconductor layers other than amorphous silicon, for example, crystalline silicon semiconductor layers such as thin film polycrystalline silicon and microcrystalline silicon, germanium semiconductor layers, and compound (CdTe, CIS, CIGS, etc.) layers. Herein, "silicon-based" materials include, in addition to silicon, silicon alloy semiconductor materials containing silicon, such as silicon carbide and silicon germanium.

The photoelectric conversion unit 11 has the one-conductivity-type layer 111 and the opposite-conductivity-type layer 113, on the light incident side and the back side of the photoelectric conversion layer 112, respectively. For example, a crystalline silicon-based photoelectric conversion unit having an intrinsic crystalline silicon-based thin film as the photoelectric conversion layer 112 preferably has a p-type layer as the one-conductivity-type layer 111 on the light incident side and an n-type layer as the opposite-conductivity-type layer 113, with light being made incident from the p-type layer side.

The crystalline photoelectric conversion unit is formed by sequentially depositing a p-type layer, an i-type layer (photoelectric conversion layer) and an n-type layer by, for example, a plasma-enhanced CVD method. A specific example thereof includes a photoelectric conversion unit in which a p-type microcrystalline silicon-based layer doped with 0.01% by atom or more of boron as a conductivity-type determining impurity atom, an intrinsic crystalline silicon layer forming a photoelectric conversion layer, and an n-type microcrystalline silicon-based layer doped with 0.01% by atom or more of phosphorus as a conductivity-type determining impurity atom are deposited in this order. Each of the p-type layer, the i-type layer and the n-type layer forming the photoelectric conversion unit is not limited to the layer described above, and for example, an amorphous silicon-based film may be used as the p-type layer. As the p-type layer, an alloy material such as amorphous or microcrystalline silicon carbide or silicon germanium may be used. The thicknesses of the conductivity-type layers (p-type layer and n-type layer) are preferably 3 nm or more and 100 nm or less, further preferably 5 nm or more and 50 nm or less.

The intrinsic crystalline silicon layer as the photoelectric conversion layer 112 is preferably deposited at a substrate temperature of 300° C. or lower by the plasma-enhanced CVD method. By depositing the crystalline silicon layer at a low temperature, hydrogen atoms can be contained in the film in a large amount. Hydrogen atoms act to terminate defects (dangling bonds) at crystalline grain boundaries and in crystalline grains to inactivate the defects. Specifically, the hydrogen content of the photoelectric conversion layer 112 preferably falls within a range of 1 to 30% by atom. This layer is preferably formed as a thin film that is a substantially intrinsic semiconductor with the density of the conductivity-type determining impurity atom being $1 \times 10^{18}$ atms/cm$^3$ or less. Further, many of crystalline grains contained in the intrinsic crystalline silicon layer are grown to extend from the transparent electrode 2 side in a columnar shape, and preferably have a preferred crystal orientation surface of (110) with respect to the film surface thereof. The thickness of the intrinsic crystalline silicon layer is preferably 1 μm or more from the viewpoint of light absorption, and preferably 10 μm or less from the viewpoint of inhibition of peeling of the crystalline thin film by internal stress.

The crystalline photoelectric conversion unit may have, as the photoelectric conversion layer, a layer of an alloy material such as a crystalline silicon carbide layer (for example, a crystalline silicon carbide layer made of crystalline silicon, which contains 10% by atom or less of carbon in a photoelectric conversion layer) or a crystalline silicon germanium layer (for example, a crystalline silicon germanium layer made of crystalline silicon, which contains 30% by atom or less of germanium in a photoelectric conversion layer) in place of the above-described intrinsic crystalline silicon layer.

It is noted that the thin film solar cell of the present invention may have one photoelectric conversion unit as shown in FIG. 1, or may have such a configuration that a plurality of photoelectric conversion units are stacked.

The back electrode 3 is formed on the photoelectric conversion unit 11. For the back electrode, for example, at least one metal layer 32 made of at least one material selected from Al, Ag, Au, Cu, Pt and Cr is preferably formed by a sputtering method, a vapor deposition method or the like. A conductive oxide layer 31 of, for example, ITO, SnO$_2$, ZnO or the like is preferably formed between the photoelectric conversion unit 11 and the metal layer 32. The conductive oxide layer 31 has a function of improving the adhesiveness between the photoelectric conversion unit 11 and the metal layer 32, increasing the photoreflectance of the back electrode 3 and preventing a chemical change in the photoelectric conversion unit.

In FIG. 1, a configuration is provided using a superstrate-type thin film solar cell in which light is made incident from the transparent insulating substrate 1, but the present invention can also be applied to a configuration in which a back electrode, a photoelectric conversion unit and a transparent electrode containing a zinc oxide film are sequentially deposited on a substrate (also referred to as a substrate-type thin film solar cell). Also in the configuration of the substrate-type thin film solar cell, since the transparent electrode containing a zinc oxide film has a high transmittance and the humidity resistance is improved, initial characteristics are excellent, and reduction of conversion efficiency during long-time use can be inhibited.

EXAMPLES

Hereinbelow, the present invention will be described in detail by way of examples; however, the present invention is not limited to the following examples as long as not departing from the gist thereof.

[Measurement Method]

Evaluations in examples and comparative examples were performed by the methods described below.

(Sheet Resistance)

A measurement was conducted using a sheet resistance measuring apparatus provided with a four-point probe method (Model "MCP-T250" manufactured by Mitsubishi Petrochemical Co., Ltd.).

(Haze Ratio)

A measurement was conducted in accordance with JIS K7136 using a haze meter with a D65 light source (Model "NDH-5000W" manufactured by NIPPON DENSHOKU INDUSTRIES CO., LTD.).

(Carrier Concentration)

A Hall measurement was conducted at a target voltage of 20 mV under a DC magnetic field of 0.503 Tesla by a Hall effect measuring apparatus employing the principle of the Van Der Pauw method (Model "HL 5500 PC" manufactured by Nanometrics Incorporated), and a carrier concentration was calculated. For calculation of the carrier concentration, the thickness of a ZnO film measured by a probe profilometer was used.

(X-Ray Diffraction Peak Intensity Ratio and Crystallite Size)

The X-ray diffraction peak intensity ratio and the crystallite size were calculated by analysis software ("PDXL software" manufactured by Rigaku Corporation) based on X-ray diffraction data measured by an X-ray diffraction measuring apparatus having a Cu·Kα ray as an X-ray source ("Smart-Lab" manufactured by Rigaku Corporation).

When the crystal orientation and the crystallite side in a planar direction parallel to the substrate surface were evaluated, a 2θ/ω mode was selected, and an about 5 mm square of a ZnO film surface was measured under conditions of X-ray intensity: 45 kV·200 mA, angle range: 2θ=25 to 80°, scanning rate: 0.12°/second and sampling interval: 0.02°. When an evaluation was performed in a planar direction perpendicular to the substrate surface, an in-plane measurement (2θχ) mode was selected, and a measurement was conducted with the scanning rate changed to 0.48°/second and the sampling interval changed to 0.04°.

For analysis of the obtained X-ray diffraction pattern, Kα2 removal and a smoothing treatment were conducted. For calculation of the crystallite size, the Scherrer method was used, the Scherrer constant was set at 0.94, and a half width was applied.

Example 1

As Example 1, a transparent electrode was formed on a glass substrate, and a substrate having a transparent electrode for a thin film solar cell was prepared for preparing a thin film solar cell shown in FIG. 1.

A glass substrate having a thickness of 5 mm and a 125 mm square size was used as a transparent insulating substrate 1, and B-doped ZnO film was deposited thereon as a transparent electrode 2 in a thickness of 2.0 μm using a low-pressure thermal CVD method. The transparent electrode 2 was formed by a CVD method under reduced-pressure conditions while feeding, as raw material gases, diethylzinc (DEZ) and water into a reaction chamber by a direct vaporization process and feeding, as a dopant gas, diborane gas diluted to 0.5% with hydrogen at a substrate temperature of 160° C. The flow ratio of water and DEZ was 2.8, and the flow ratio of diborane and DEZ was 0.25% (DEZ:diborane diluted with hydrogen=2:1).

Example 2

Also in Example 2, a substrate having a transparent electrode for a thin film solar cell was prepared in the same manner as in Example 1, but unlike Example 1, the substrate temperature during deposition of the ZnO film was changed to 165° C. and the flow ratio of water/DEZ was changed to 3.

Example 3

Also in Example 3, a substrate having a transparent electrode for a thin film solar cell was prepared in the same manner as in Example 1, but unlike Example 1, the ZnO film was deposited in a thickness of 2.2 μm.

Example 4

In Example 4, a substrate having a transparent electrode for a thin film solar cell was prepared in the same manner as in Example 1. Subsequently, Ar gas was introduced into a vacuum chamber at 250° C., and the substrate having a transparent electrode was subjected to heat-treatment under a pressure of 100 Pa for an hour.

Comparative Example 1

Also in Comparative Example 1, a substrate having a transparent electrode for a thin film solar cell was prepared in the same manner as in Example 1, but unlike Example 1, the substrate temperature during deposition of the ZnO film was changed to 150° C. and the flow ratio of water/DEZ was changed to 1.7.

Comparative Example 2

Also in Comparative Example 2, a substrate having a transparent electrode for a thin film solar cell was prepared in the same manner as in Example 1, but unlike Example 1, the flow ratio of diborane and DEZ during deposition of the ZnO film was changed to 0.7% (feed rate of DEZ:diborane diluted with hydrogen=1:1.4).

Deposition conditions and evaluation results for the zinc oxide film in each of Examples 1 to 4 and Comparative Examples 1 and 2 are shown in Table 1.

TABLE 1

| | ZnO film deposition conditions | | | | | ZnO film properties | | | | | |
| | | | gas feed rate | | | | | crystalline properties | | resistance | |
| | | | | | | | | | | | after |
| | thickness | substrate temperature | Water/ DEZ | $B_2H_6$/ DEZ | remarks | haze ratio | carrier concentration | I(110)/ I(002) | crystallite size | initial | humidification test |
| | nm | ° C. | | % | | % | $10^{19}/cm^3$ | | nm | nm Ω/sq | Ω/sq |
| Example 1 | 2000 | 160 | 2.8 | 0.25 | — | 27 | 6.1 | 52.3 | 27 | 34 11 | 30 |
| Example 2 | 2000 | 165 | 3 | 0.25 | — | 29 | 8 | 61.9 | 27 | 36 9.8 | 22 |
| Example 3 | 2200 | 160 | 2.8 | 0.25 | — | 29 | 5.5 | 63.1 | 28 | 38 10.1 | 25 |
| Example 4 | 2000 | 160 | 2.8 | 0.25 | *1 | 28 | 8.1 | 70.2 | 27 | 38 10.2 | 15 |
| Comparative Example 1 | 2000 | 150 | 1.7 | 0.25 | — | 22 | 7.9 | 25.5 | 22 | 27 12 | 150 |
| Comparative Example 2 | 2000 | 160 | 2.8 | 0.7 | — | 15 | 14 | 46.7 | 23 | 25 6.8 | 10 |

*1: heat-treatment was performed after the ZnO deposition

The substrate having a ZnO film obtained in Comparative Example 1 had a considerable increase in sheet resistance after being exposed under an environment with a temperature of 85° C. and a humidity of 85% for 24 hours. The resistance change behavior was close to the characteristics shown in Non-Patent Document 1. From the results of Example 1 and Comparative Example 1, it is understood that the transparent electrode of Example 1 has a reduced resistance change under a humid environment as compared to that of Comparative Example 1.

On the other hand, the substrate having a ZnO film obtained in Comparative Example 2 had a reduced resistance change when exposed to a high-humidity environment even though the size of the crystallite in the ZnO film was small because the carrier concentration of the ZnO film was high. However, the substrate having a ZnO film in Comparative Example 2 has a high carrier concentration, and may have a reduction in conversion efficiency resulting from light absorption by a carrier when used as a transparent electrode for a thin film solar cell. It is understood that the ZnO film obtained in Comparative Example 2 has a low haze ratio, so that it is difficult to achieve both a haze ratio and a transmittance which are suitable for improvement of efficiency of a thin film solar cell.

In contrast, the ZnO films of Examples 1 to 4 are deposited by the low-pressure thermal CVD method that used in Comparative Example 1, but have a reduced resistance change under a high-humidity environment as compared to the ZnO film of Comparative Example 1. It can be said that the ZnO films of Examples 1 to 4 improve thin film solar cell efficiency because the carrier concentration is low and the size of surface irregularities is large as compared to the ZnO film of Comparative Example 2.

Comparison of Comparative Example 1, Example 1 and Example 2 shows that by increasing the substrate temperature during deposition of the ZnO film by low-pressure thermal CVD and the feed ratio of water to DEZ, the (110) orientation and the crystallite size can be enhanced. It is understood from comparison of Example 1, Example 3 and Example 4 that the (110) orientation and the crystallite size can also be enhanced by increasing the deposition thickness of the ZnO film and performing a heat treatment after deposition.

Example 5

As Example 5, a crystalline silicon-based thin film solar cell as shown in FIG. 1 was prepared using a transparent electrode formed under the conditions of Example 1. That is, on the transparent electrode 2 of the substrate having a transparent electrode for a thin film solar cell as obtained in Example 1, a p-type microcrystalline silicon layer 111 having a thickness of 15 nm, a crystalline photoelectric conversion layer 112 of intrinsic crystalline silicon having a thickness of 1.8 μm and an n-type microcrystalline silicon layer 113 having a thickness of 15 nm were sequentially deposited by a plasma-enhanced CVD method. Thereafter, a conductive oxide layer 31 of Al-doped ZnO having a thickness of 90 nm and a metal layer 32 of Ag having a thickness of 300 nm were sequentially deposited as a back electrode 3 by a sputtering method.

Example 6

Also in Example 6, a crystalline silicon-based thin film solar cell was prepared in the same manner as in Example 5. However, unlike Example 5, the transparent electrode described in Example 2 was applied as the transparent electrode 2.

Example 7

Also in Example 7, a crystalline silicon-based thin film solar cell was prepared in the same manner as in Example 5. However, unlike Example 5, the transparent electrode described in Example 3 was applied as the transparent electrode 2.

Example 8

Also in Example 8, a crystalline silicon-based thin film solar cell was prepared in the same manner as in Example 5. However, unlike Example 5, the transparent electrode described in Example 4 was applied as the transparent electrode 2.

Comparative Example 3

Also in Comparative Example 3, a crystalline silicon-based thin film solar cell was prepared in the same manner as in Example 5. However, unlike Example 5, the transparent electrode described in Comparative Example 1 was applied as the transparent electrode 2.

The crystalline silicon-based thin film solar cells prepared in Examples 5 to 8 and Comparative Example 3 were irradiated with light of AM 1.5 in a light amount of 100 mW/cm$^2$, and the open circuit voltage (Voc), the short circuit current density (Jsc), the fill factor (FF) and the conversion efficiency (Eff) were measured. Each crystalline silicon-based thin film solar cell was exposed to an environment having a temperature of 85° C. and a humidity of 85% for 24 hours, followed by measuring the conversion efficiency (Eff) of the thin film solar cell again to determine an amount of reduction in conversion efficiency ΔEff=Eff−Eff'. A solar cell provided for actual use is sealed with a resin and a film, while the solar cells of examples and comparative examples are not sealed, and therefore the evaluations by the humidification test described above correspond to an accelerated test under severe conditions. Measurement results for the output characteristics of the solar cells of examples and comparative examples are shown in Table 2.

TABLE 2

| | initial | | | | after humidification test | |
|---|---|---|---|---|---|---|
| | Voc mV | Jsc mA/cm$^2$ | FF | Eff % | Eff % | ΔEff % |
| Example 5 | 0.53 | 28.5 | 0.72 | 10.9 | 10.1 | 0.8 |
| Example 6 | 0.52 | 28.9 | 0.73 | 11.0 | 10.5 | 0.5 |
| Example 7 | 0.52 | 29.0 | 0.725 | 10.9 | 10.3 | 0.6 |
| Example 8 | 0.52 | 29.0 | 0.73 | 11.0 | 10.3 | 0.7 |
| Comparative Example 3 | 0.53 | 27.3 | 0.71 | 10.3 | 9.1 | 1.2 |

Comparison of Tables 1 and 2 shows that there is a correlation between an increase in resistance of the transparent electrode and a reduction in conversion efficiency of the solar cell before and after the humidification test. The output characteristics of the solar cell of Example 5 after the humidification test has an open circuit voltage (Voc) of 0.53 V, a short circuit current density (Jsc) of 28.4 mA/cm$^2$ and a fill factor (FF) of 0.67, with the FF being mainly reduced as compared to the values before the humidification test. From this fact, it is believed that a reduction of the FF resulting from an increase in resistance of the transparent electrode by humidification affects the conversion efficiency. That is, it is believed that the thin film solar cell including the transparent electrode of the present invention has a small reduction in conversion efficiency even though exposed to a humidified environment because an increase in resistance of the transparent electrode is inhibited.

As demonstrated above, the thin film solar cell using the transparent electrode of the present invention has improved initial characteristics, with degradation in characteristics during long-time use being inhibited. These transparent electrodes are suitably used not only for crystalline silicon-based thin film solar cells but also for other silicon-based thin film solar cells, thin film compound solar cells and the like.

DESCRIPTION OF REFERENCE CHARACTERS

1 transparent insulating substrate
2 transparent electrode
11 photoelectric conversion unit
111 one-conductivity-type layer 112 photoelectric conversion layer
113 opposite-conductivity-type layer
3 back electrode
31 conductive oxide layer
32 metal layer

The invention claimed is:

1. A transparent electrode for a thin film solar cell, comprising
a transparent conductive film consisting essentially of zinc oxide, wherein
the transparent conductive film has the following characteristics:
the transparent conductive film has surface irregularities with a height of 20 to 200 nm;
a carrier concentration of the transparent conductive film is $9\times10^{19}$ cm$^{-3}$ or less;
a crystal structure of the transparent conductive film has a (110) preferred orientation;
a ratio of a (110) peak intensity to a (002) peak intensity I(110)/I(002) of the transparent conductive film as measured by X-ray diffraction is 50 or more; and
a crystallite of the transparent conductive film with a (110) orientation has a size of: 23 nm or more and 50 nm or less, in a planar direction parallel to a substrate, and 30 nm or more and 60 nm or less, in a planar direction perpendicular to the substrate.

2. A substrate having a transparent electrode for a thin film solar cell, comprising:
a transparent insulating substrate; and
the transparent electrode according to claim 1 formed thereon.

3. The substrate having the transparent electrode according to claim 2, having a haze ratio of 20 to 50%.

4. A thin film solar cell, comprising:
the substrate having the transparent electrode according to claim 2; and
at least one photoelectric conversion unit;
wherein the substrate having the transparent electrode is placed on a light incident side with respect to the at least one photoelectric conversion unit, and
the transparent electrode comprises the transparent conductive film that has surface irregularities with a height of 20 to 200 nm.

5. The thin film solar cell according to claim 4, wherein a pitch of the surface irregularities of the transparent conductive film is 50 to 500 nm.

6. A thin film solar cell, comprising:
the transparent electrode according to claim 1; and
at least one photoelectric conversion unit;
wherein the transparent electrode is placed on a light incident side with respect to the at least one photoelectric conversion unit.

7. The thin film solar cell according to claim 4, comprising:
a crystalline photoelectric conversion unit as the at least one photoelectric conversion unit.

8. The substrate having a transparent electrode according to claim 1, wherein a pitch of the surface irregularities of the transparent conductive film is 50 to 500 nm.

9. A production method for a transparent electrode for a thin film solar cell, wherein the transparent electrode comprises a transparent conductive film consisting essentially of zinc oxide, the transparent conductive film having the following characteristics:
the transparent conductive film has surface irregularities with a height of 20 to 200 nm;
a carrier concentration of the transparent conductive film is $9\times10^{19}$ cm$^{-3}$ or less;
a crystal structure of the transparent conductive film has a (110) preferred orientation;
a ratio of a (110) peak intensity to a (002) peak intensity I(110)/I(002) of the transparent conductive film as measured by X-ray diffraction is 50 or more; and
a crystallite with a (110) orientation has a size of: 23 nm or more and 50 nm or less, in a planar direction parallel to a substrate, and 30 nm or more and 60 nm or less, in a planar direction perpendicular to the substrate, and
wherein the production method comprises a step of depositing the transparent conductive film by a low-pressure thermal CVD method.

10. The production method for a transparent electrode according to claim 9, wherein
in deposition of the transparent conductive film, diethylzinc and water are used as raw materials, and a feed rate of water is equal to or more than twice the feed rate of diethylzinc.

11. The production method for a transparent electrode according to claim 9, further comprising a step of heating a zinc oxide film under a nonoxidative gas atmosphere, subsequently to the step of depositing the transparent conductive film by the low-pressure thermal CVD method.

* * * * *